(12) United States Patent
Sirard et al.

(10) Patent No.: US 11,862,473 B2
(45) Date of Patent: Jan. 2, 2024

(54) CONTROLLED DEGRADATION OF A STIMULI-RESPONSIVE POLYMER FILM

(71) Applicant: Lam Research Corporation, Fremont, CA (US)

(72) Inventors: Stephen M. Sirard, Austin, TX (US); Gregory Blachut, Campbell, CA (US); Diane Hymes, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/998,489

(22) PCT Filed: May 10, 2021

(86) PCT No.: PCT/US2021/031595
§ 371 (c)(1),
(2) Date: Nov. 10, 2022

(87) PCT Pub. No.: WO2021/231307
PCT Pub. Date: Nov. 18, 2021

(65) Prior Publication Data
US 2023/0136036 A1 May 4, 2023

Related U.S. Application Data

(60) Provisional application No. 63/023,676, filed on May 12, 2020.

(51) Int. Cl.
*H01L 21/311* (2006.01)
*H01L 21/302* (2006.01)
*H01L 21/306* (2006.01)

(52) U.S. Cl.
CPC ...... *H01L 21/31138* (2013.01); *H01L 21/302* (2013.01); *H01L 21/306* (2013.01); *H01L 21/31127* (2013.01)

(58) Field of Classification Search
None
See application file for complete search history.

(56) References Cited

U.S. PATENT DOCUMENTS

| 5,571,447 A | 11/1996 | Ward et al. |
| 6,337,277 B1 | 1/2002 | Chou et al. |

(Continued)

FOREIGN PATENT DOCUMENTS

| CN | 1027419 C | 1/1995 |
| CN | 1531745 A | 9/2004 |

(Continued)

OTHER PUBLICATIONS

International Search Report and Written Opinion issued in PCT Application PCT/US2021/031595 dated Aug. 30, 2021.

(Continued)

*Primary Examiner* — Jiong-Ping Lu
(74) *Attorney, Agent, or Firm* — Weaver Austin Villeneuve & Sampson LLP

(57) ABSTRACT

Removing a stimuli responsive polymer (SRP) from a substrate includes controlled degradation. In certain embodiments of the methods described herein, removing SRPs includes exposure to two reactants that react to form an acid or base that can trigger the degradation of the SRP. The exposure occurs sequentially to provide more precise top down control. In some embodiments, the methods involve diffusing a compound, or a reactant that reacts to form a compound, only to a top portion of the SRP. The top portion is then degraded and removed, leaving film the remaining SRP intact. The exposure and removal cycles are repeated.

37 Claims, 9 Drawing Sheets

(56) References Cited

U.S. PATENT DOCUMENTS

| | | | |
|---|---|---|---|
| 6,573,201 | B1 | 6/2003 | Ogure et al. |
| 7,011,716 | B2 | 3/2006 | Xu et al. |
| 9,466,511 | B2 | 10/2016 | Limary et al. |
| 10,662,274 | B2 | 5/2020 | Kohl et al. |
| 2003/0224586 | A1 | 12/2003 | Sabnis |
| 2004/0040653 | A1 | 3/2004 | Nuzzo et al. |
| 2004/0087176 | A1 | 5/2004 | Colburn et al. |
| 2004/0146803 | A1 | 7/2004 | Kohl et al. |
| 2005/0106493 | A1 | 5/2005 | Ho et al. |
| 2006/0089003 | A1 | 4/2006 | Cheng et al. |
| 2006/0257758 | A1 | 11/2006 | Daley et al. |
| 2009/0130863 | A1 | 5/2009 | Toma et al. |
| 2009/0142931 | A1 | 6/2009 | Wang et al. |
| 2009/0286188 | A1 | 11/2009 | Hatakeyama et al. |
| 2010/0255303 | A1 | 10/2010 | Wardle et al. |
| 2011/0189858 | A1 | 8/2011 | Yasseri et al. |
| 2014/0242623 | A1 | 8/2014 | Phillips et al. |
| 2014/0253137 | A1 | 9/2014 | Chuang et al. |
| 2014/0373384 | A1 | 12/2014 | Sirard et al. |
| 2015/0221500 | A1 | 8/2015 | Ogihara et al. |
| 2015/0228533 | A1 | 8/2015 | Hwang et al. |
| 2016/0086829 | A1 | 3/2016 | Limary et al. |
| 2017/0098541 | A1 | 4/2017 | Gouk et al. |
| 2017/0273192 | A1 | 9/2017 | Sato et al. |
| 2017/0345683 | A1 | 11/2017 | Sasaki et al. |
| 2018/0155483 | A1 | 6/2018 | Kohl et al. |
| 2018/0204770 | A1 | 7/2018 | Varaprasad et al. |
| 2018/0308695 | A1* | 10/2018 | LaVoie ............. H01L 21/31138 |
| 2018/0315725 | A1 | 11/2018 | Lin et al. |
| 2018/0335697 | A1 | 11/2018 | Wang et al. |
| 2019/0015878 | A1 | 1/2019 | Kawaguchi et al. |
| 2019/0088470 | A1 | 3/2019 | Varaprasad et al. |
| 2019/0385903 | A1 | 12/2019 | Kikuchi et al. |
| 2020/0013613 | A1 | 1/2020 | Blanquart |
| 2020/0040282 | A1 | 2/2020 | Aoki et al. |
| 2022/0301859 | A1 | 9/2022 | Blachut et al. |
| 2022/0328338 | A1 | 10/2022 | Blachut et al. |

FOREIGN PATENT DOCUMENTS

| | | | |
|---|---|---|---|
| JP | H09275085 | A | 10/1997 |
| JP | H1121496 | A | 1/1999 |
| JP | 2005183751 | A | 7/2005 |
| JP | 2012049446 | A | 3/2012 |
| JP | 2013016699 | A | 1/2013 |
| JP | 2015092619 | A | 5/2015 |
| JP | 2015106645 | A | 6/2015 |
| JP | 2016032063 | A | 3/2016 |
| JP | 2017152600 | A | 8/2017 |
| KR | 20010004411 | A | 1/2001 |
| KR | 20090006551 | A | 1/2009 |
| KR | 101827020 | B1 | 3/2018 |
| TW | 200813212 | A | 3/2008 |
| WO | WO-2014161036 | A1 | 10/2014 |
| WO | WO-2020033015 | A2 | 2/2020 |
| WO | WO-2021030252 | A1 | 2/2021 |
| WO | WO-2021046572 | A1 | 3/2021 |

OTHER PUBLICATIONS

Chinese First Office Action dated Nov. 27, 2017 issued in Application No. CN 2015105932346.

Feinberg, et al., "Cyclic Poly(phthalaldehyde): Thermoforming a Bulk Transient Material" ACS Macro Lett., 2018, vol. 7, pp. 47-52.
International Search Report and Written Opinion dated Dec. 18, 2020, in Application No. PCT/US2020/070483.
International Preliminary Report on Patentability dated Aug. 12, 2021 issued in Application No. PCT/US2020/015451.
International Preliminary Report on Patentability dated Mar. 17, 2022 in PCT Application No. PCT/US2020/048955.
International Preliminary Report on Patentability dated Mar. 17, 2022 in PCT Application No. PCT/US2020/070483.
International Search Report and Written Opinion dated Dec. 15, 2020 issued in Application No. PCT/US2020/048955.
International Search Report and Written Opinion dated Jan. 3, 2022 in Application No. PCT/US2021/049713.
International Search Report and Written Opinion dated May 27, 2020 issued in Application No. PCT/US2020/015451.
International Search Report and Written Opinion dated Nov. 18, 2021, in PCT Application No. PCT/US2021/042978.
International Search Report and Written Opinion dated Oct. 26, 2021, in application No. PCT/US2021/040009.
International Search Report and Written Opinion dated Aug. 25, 2021, in Application No. PCT/US2021/031594.
Kaitz, J. A. et al., "End Group Characterization of Poly(Phthalaldehyde): Surprising Discovery of a Reversible, Cationic Macrocyclization Mechanism", Journal of the American Chemical Society, 2013, vol. 135, pp. 12755-12761.
KR Office Action dated Apr. 29, 2022, in Application No. KR10-2015-0131204 with English translation.
Notice of Allowance dated Jun. 8, 2016 issued in U.S. Appl. No. 14/489,615.
Office Action dated Mar. 8, 2016 issued in U.S. Appl. No. 14/489,615.
Schwartz, J. M. et al., "Stable, high-molecular-weight poly(phthalaldehyde)", Journal of polymer science, part A: polymer chemistry, 2016, vol. 55, pp. 1166-1172.
Taiwanese First Office Action dated Dec. 11, 2020 issued in Application No. TW 109112730.
TW Decision of Refusal dated Sep. 14, 2021, in application No. TW109112730 with English translation.
U.S. Appl. No. 17/310,303, inventors Sirard et al., filed Jul. 27, 2021.
International Preliminary Report on Patentability dated Jan. 12, 2023, in PCT Application No. PCT/US2021/040009.
International Preliminary Report on Patentability dated Nov. 24, 2022, in PCT Application No. PCT/U82021/031595.
International Preliminary Report on Patentability dated Nov. 24, 2022, in PCT Application No. PCT/US2021/031594.
International Preliminary Report on Patentability dated Feb. 9, 2023 in PCT Application No. PCT/US2021/042978.
International Preliminary Report on Patentability dated Mar. 23, 2023 in Application No. PCT/US2021/049713.
International Search Report and Written Opinion dated Jan. 12, 2023 in PCT Application No. PCT/US2022/044750.
SG Search Report and Written Opinion dated Dec. 16, 2022 in Application No. SG11202108294U.
TW Office Action dated Nov. 11, 2022, in Application No. TW109112730 with English Translation.
Uzunlar, E. et al., "Decomposable and Template Polymers: Fundamentals and Applications", Journal of Electronic Packaging, Apr. 19, 2016, vol. 138, No. 2, pp. 1-15.
Wood, J.D. et al., "Annealing Free, Clean Graphene Transfer Using Alternative Polymer Scaffolds", Nanotechnology, Jan. 12, 2015, vol. 26, No. 5, pp. 1-9.

* cited by examiner

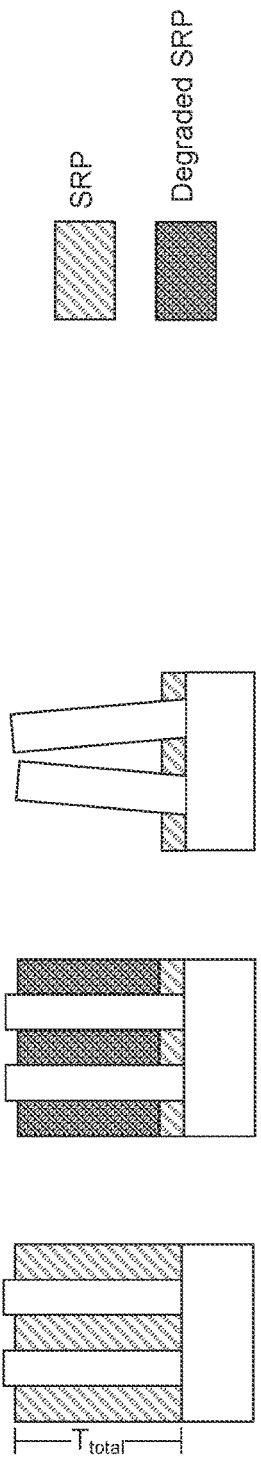
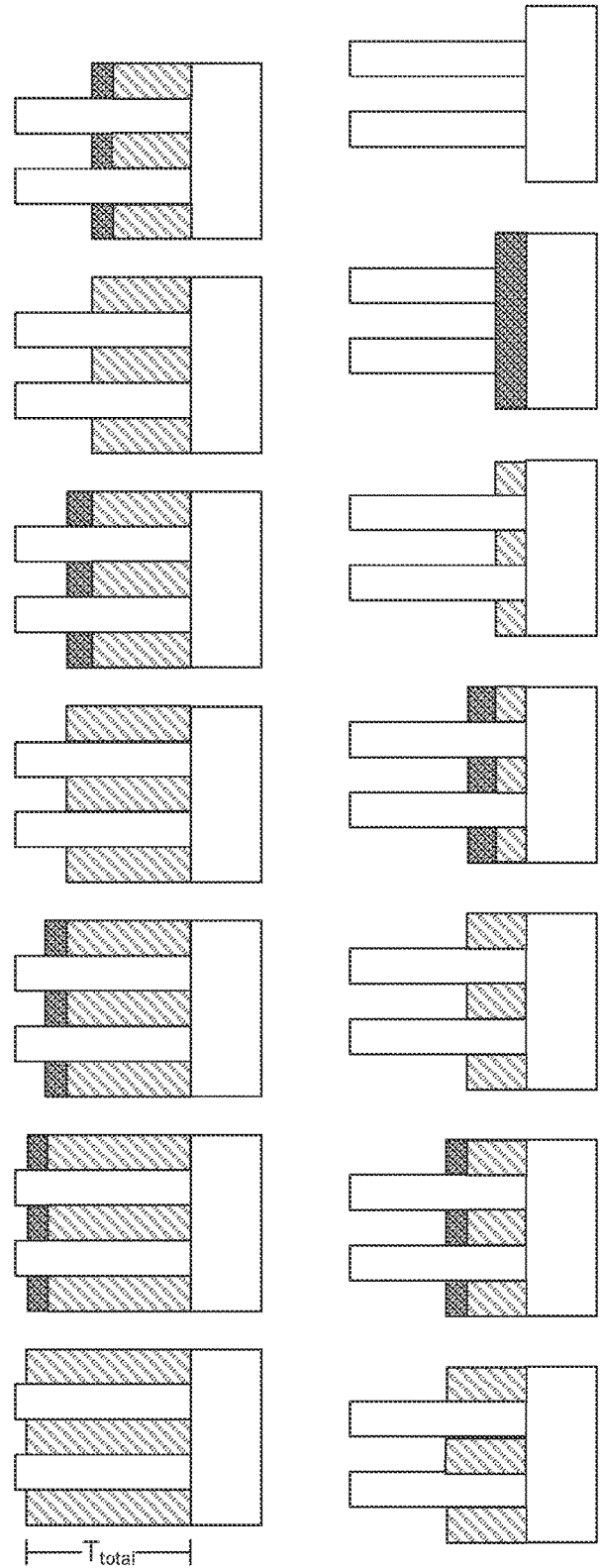
FIG. 2A
FIG. 2B

CONTROLLED DEGRADATION OF A STIMULI-RESPONSIVE POLYMER FILM

INCORPORATION BY REFERENCE

A PCT Request Form is filed concurrently with this specification as part of the present application, Each application that the present application claims benefit of or priority to as identified in the concurrently filed PCT Request Form is incorporated by reference herein in its entirety and for all purposes.

BACKGROUND

As semiconductor devices continue to scale down to smaller sizes, higher aspect ratio structures are used to achieve the desired device performance. The fabrication of semiconductor devices involves multiple iterations of processes such as material deposition, planarization, feature patterning, feature etching, and feature cleaning. The drive towards higher aspect ratio structures creates processing challenges for many of these traditional fabrication steps. Wet processes such as etch and clean, which may make up greater than 23% of the overall process flow, are particularly challenging on high aspect ratio (HAR) features due to the capillary forces that are generated during drying. The strength of these capillary forces depends on the surface tension and contact angle of the etch, clean, or rinse fluids that are being dried, as well as the feature spacing and aspect ratio. If the forces generated during drying are too high, then the high aspect ratio features will collapse onto each other and stiction may occur. Feature collapse and stiction will severely degrade the device yield.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Removing a stimuli responsive polymer (SRP) from a substrate includes controlled degradation. In certain embodiments of the methods described herein, removing an SRP includes exposure to two reactants that react to form an acid or base that can trigger the degradation of the SRP. The exposure occurs sequentially to provide more precise top down control. In some embodiments, the methods involve diffusing a compound, or a reactant that reacts to form a compound, only to a top portion of the SRP. The top portion is then degraded and removed, leaving the remaining SRP intact. The exposure and removal cycles are repeated.

One aspect of the disclosure relates to a method including: providing to a chamber a high aspect ratio (HAR) structure having a stimulus responsive polymer (SRP) in a high aspect ratio gap formed between features of the HAR structure, the high aspect ratio gap having a total thickness $T_{total}$; and performing one or more cycles of removing the SRP from the gap including, each cycle including:
  (a) pulsing a first reactant to the chamber such that the first reactant diffuses into the gap on to a depth less than $T_{total}$;
  (b) after (a), purging the chamber,
  (c) after (b), pulsing a second reactant to the chamber such that the second reactant diffuses into the gap only to a depth less than $T_{total}$;
  (d) reacting the first reactant and the second reactant to form a compound that degrades the SRP;
  (e) degrading a thickness of SRP that is less than $T_{total}$; and
  (f) removing the degraded SRP.

In some embodiments, the SRP includes a poly(phthalaldehyde) or a derivative thereof as a homopolymer or as one of the polymers of a copolymer. In some embodiments, the SRP includes a poly(aldehyde) or a derivative thereof as a homopolymer or as one of the polymers of a copolymer.

In some embodiments, the first or second reactant is water vapor. In some such embodiments, the other of the first or second reactant is ammonia or a gaseous oxide that reacts with the water vapor to an acidic or basic species. Examples of gaseous oxides include nitrogen dioxide, sulfur dioxide, and carbon dioxide.

In some embodiments, a target diffusion depth in (a) and (c) is the same. In some embodiments, a target diffusion depth in (a) and (c) is different. In some embodiments, the reaction in (d) is uncatalyzed. In some embodiments, the compound is an acid or base, Examples include sulfurous acid, nitric acid, carbonic acid, and ammonium hydroxide.

Another aspect of the disclosure relates to a method including: providing to a chamber a high aspect ratio (HAR) structure having a stimulus responsive polymer (SRP) in a high aspect ratio gap formed between features of the HAR structure, the SRP film having a total thickness $T_{total}$; and performing one or more cycles of removing the SRP from the gap including, each cycle including:
  (a) pulsing first reactant to the chamber such that the first reactant diffuses into the gap to a depth $D_{first\ reactant}$;
  (b) after (a), purging the chamber,
  (c) after (b), pulsing a second reactant to the chamber such that the second reactant diffuses into the gap only to a depth $D_{second\ reactant}$, wherein $D_{second\ reactant}$ is less than $D_{first\ reactant}$;
  (d) reacting the first reactant and the second reactant to form a compound that degrades the SRP;
  (e) degrading the SRP to a depth $D_{second\ reactant}$; and
  (f) removing the degraded SRP.

In some embodiments, the SRP includes a poly(phthalaldehyde) or a derivative thereof as a homopolymer or as one of the polymers of a copolymer. In some embodiments, the SRP includes a poly(aldehyde) or a derivative thereof as a homopolymer or as one of the polymers of a copolymer.

In some embodiments, the first or second reactant is water vapor. In some such embodiments, the other of the first or second reactant is ammonia or a gaseous oxide that reacts with the water vapor to an acidic or basic species. Examples of gaseous oxides include nitrogen dioxide, sulfur dioxide, and carbon dioxide.

In some embodiments, $D_{first\ reactant}$ is equal to $T_{total}$ such that the first reactant is diffused through the total thickness of the SRP film in a single cycle. In some embodiments, $D_{first\ reactant}$ is less than $T_{total}$ and multiple cycles are performed. In some embodiments, the reaction in (d) is uncatalyzed. In some embodiments, the compound is an acid or base. Examples include sulfurous acid, nitric acid, carbonic acid, and ammonium hydroxide.

Another aspect of the disclosure relates to a method including:
  providing a substrate having a stimulus responsive polymer (SRP) thereon;

performing multiple removal cycles, each cycle including:
  exposing only a top portion of the SRP to a compound capable of degrading the SRP to thereby degrade the top portion of the SRP; and
  removing only the top portion of the SRP.

In some embodiments, the SRP is provided without a catalyst. In some embodiments, exposing the top portion of the SRP to a compound includes pulsing the compound in vapor phase into a chamber housing the substrate. Examples of compounds include hydrogen bromide (HBr), hydrogen chloride (HCl), hydrogen fluoride (HF), hydrogen iodide (HI), nitric acid (HNO3), formic acid ($CH_2O_2$), acetic add ($CH_3COOH$), formonitrile (HCN), or ammonia ($NH_3$), and methyl or ethyl amine gas.

In some embodiments, exposing the top portion of the SRP includes sequential pulsing of a first reactant and a second reactant, wherein the first reactant and the second reactant react to from the compound. In some such embodiments, the first reactant and second reactant react in the top portion of the SRP film. In some embodiments, exposing the top portion of the SRP includes a first puke of a first reactant followed by multiple sequential pulses of a second reactant, wherein the first reactant and the second reactant react to form the compound. In some embodiments, sequential pulses are separated by inert gas purges.

In some embodiments, the SRP includes a poly(phthalaldehyde) or a derivative thereof as a homopolymer or as one of the polymers of a copolymer. In some embodiments, the SRP includes a poly(aldehyde) or a derivative thereof as a homopolymer or as one of the polymers of a copolymer.

In some embodiments, the SRP is provided between features of high aspect ratio (HAR) structures. In some embodiments, the SRP is provided as a protective coating on substrate.

These and other aspects are discussed below with reference to the drawings.

BRIEF DESCRIPTION OF DRAWINGS

FIG. 2A shows a side cross-sectional view of an example of a high aspect ratio (HAR) structure in which enough of the SRP is removed in a single removal that the structure features collapse.

FIG. 2B shows a side cross-sectional view of an example of a high aspect ratio (HAR) structure in which the SRP removal is controlled to prevent collapse.

DETAILED DESCRIPTION

Figure 1A:
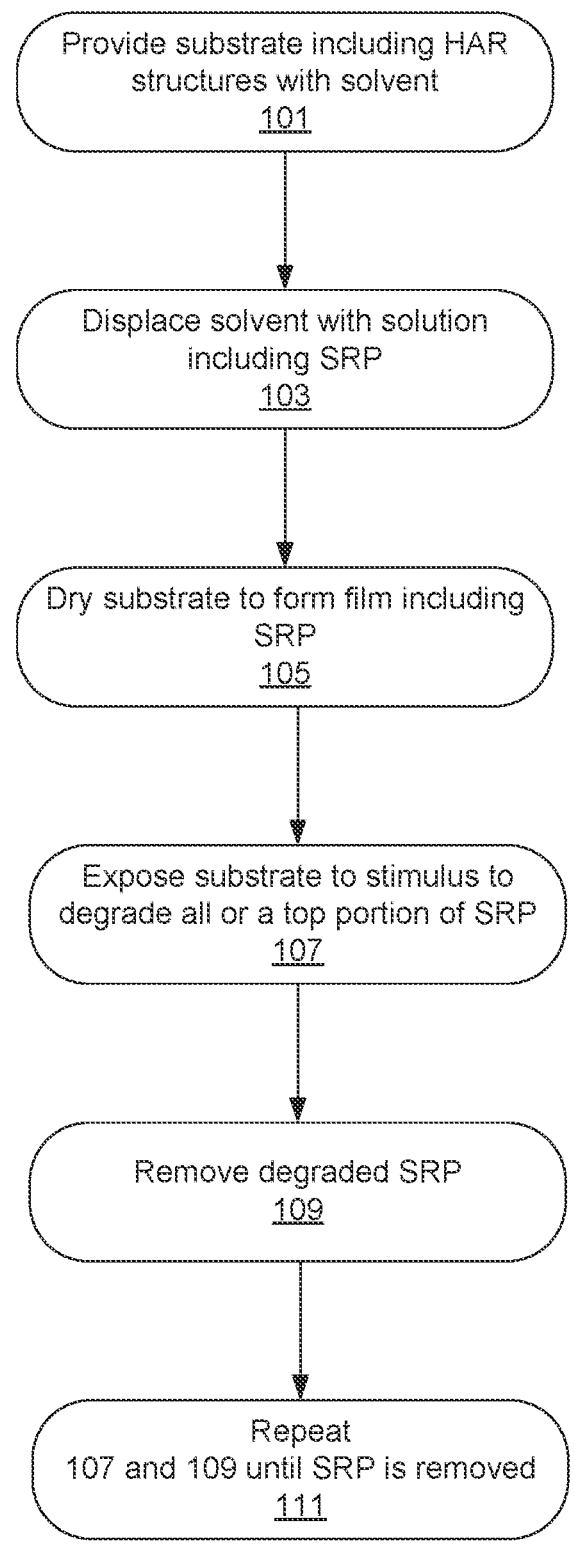
FIGS. 1A and 1B are flow diagrams showing certain operations in examples semiconductor fabrication processes that use stimulus response polymers (SRPs).

Stimuli responsive polymers (SRPs) may be used in semiconductor fabrication processes for sacrificial bracing of high aspect ratio (HAR) structures. Low ceiling temperature SRPs can be spontaneously removed when exposed to stimuli such as mildly elevated temperatures or acidic vapors, avoiding aggressive wet or dry removal chemistries that may harm the substrate surface. These SRPs can also be used for surface protection from airborne molecular contaminants and queue-time extension.

As indicated above, in many embodiments, the SRPs are low ceiling temperature ($T_c$) polymers. $T_c$ is the equilibrium temperature between a polymer and its monomers. As used herein, the term low $T_c$ refers to $T_c$ values below a removal temperature. In some embodiments, the $T_c$ is below room temperature, such that the polymers are thermodynamically unstable at room temperature. Instead, the low $T_c$ polymer is kinetically trapped to allow prolonged storage at room temperature. In some examples, the stable storage period is on the order of months or years. Low $T_c$ polymers will rapidly de-polymerize to its monomer constituents if an end-group or main chain bond is broken. Thus, the polymer de-polymerizes in response to stimuli such as ultraviolet (UV) light, heat, or an acidic/basic catalyst or compound. The monomer products are volatile and leave or can be easily removed from the surface and chamber.

While in some embodiments, the $T_c$ is below room temperature, in the context of semiconductor processing, low $T_c$ may also refer to ceiling temperatures that are higher than room temperature. For example, removal temperatures of up to 400° C. may be used, meaning that the ceiling temperature is below 400° C., with the polymer kinetically trapped below the ceiling temperature.

In some embodiments of the methods described herein, removing an SRP includes controlled degradation by diffusing a compound, or a reactant that reacts to form a compound, only to a top portion of the SRP. The top portion is then degraded and removed, leaving the remaining SRP intact. The exposure and removal cycles are repeated.

In some embodiments of the methods described herein, removing SRPs includes exposure to two reactants that react to form an acid or base that can trigger the degradation of the SRP. The exposure occurs sequentially to provide more precise top down control. A first reactant may be provided in gaseous form and diffuses into the SRP. Pressure, temperature, flow rate, and exposure time may be controlled to modulate the depth of diffusion. The first reactant is then purged, and the second reactant is provided in gaseous form to diffuse into the SRP. Pressure, temperature, flow rate, and exposure time may be controlled to modulate the depth of diffusion. A reaction occurs only to the depth and extent that the first and second reactants are both present in the SRP. Thus, all or only a portion of the SRP is degraded and removed in a cycle.

The methods described above allow removal of the SRP at lower temperatures than using heat by itself as a stimulus. This can be advantageous for avoiding the formation of non-volatile carbonaceous species (char). Further, the methods allowed controlled removal without adding non-volatile catalysts, dyes, or other additives to the film. Eliminating low volatility additives and char results in a significant reduction or elimination of residues upon SRP removal.

Figure 1B:
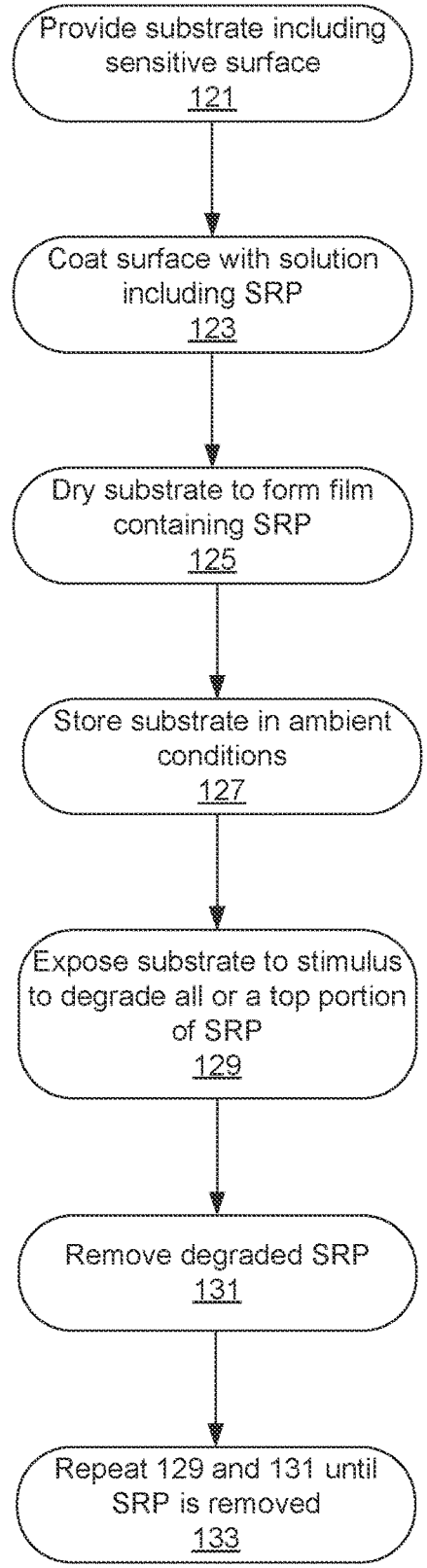

Examples of processes that involve the use of sacrificial SRPs are described below with reference to FIGS. 1A and 1B, with further details of the removal process provided with reference to FIGS. 2-7. Turning to FIG. 1A, an example of a method for bracing HAR structures using an SRP is shown. First at an operation 101, a substrate including HAR structures with a solvent is provided. HAR structures are structures having high aspect ratios (ARs), e.g., at least 8, 10, 20, 30, 40, or 80. The substrate may be provided, for example, after a wet etch or cleaning operation and have solvent associated with the prior operation. In some embodiments, the solvent in operation 101 may be a transitional solvent if the prior solvent is not chemically compatible with the SRP solution.

Next in an operation 103, the solvent is displaced with a solution that includes a stimuli responsive polymer (SRP). The substrate is then dried in an operation 105. The SRP solidifies as the liquid portion solution is removed and the SRP fills the HAR structures. A mechanical brace forms in the HAR structures to prevent collapse of the structures due to capillary forces that are generated during solvent drying. The fill may include one or more additional components, Such additional components may include stabilizers, surfactants, and/or plasticizers.

The substrate is then exposed to a stimulus to degrade all of or only the top portion of the SRP in an operation 107. As described further below, operation 107 may involve controlled exposure to a compound or to two reactants that react to form a compound that degrades the SRP. The stimulus is any compound that scissions bonds of the SRP to degrade it. In some embodiments, the compound is a relatively strong add or base. Volatile monomers or fragments from the degraded polymer can then be removed from the structure in an operation 109. If SRP is still present, operations 107 and 109 are repeated one or more times to remove all the SRP in an operation 111. The amount of SRP removed in each repetition may be the same or different.

The number of repetitions is such that bracing remaining after each cycle of operation 107 and 109 can withstand the capillary forces without collapsing. FIGS. 2A and 2B, which show HAR structures having SRP films of thickness $T_{total}$, illustrate schematically the difference between too few and enough cycles. FIG. 2A shows a side cross-sectional view of an example of a HAR structure in which too much of the SRP is removed in a single removal. The high aspect ratio features collapse. In FIG. 2B, by contrast, the structure remains intact.

SRPs may also be used in the semiconductor fabrication processes for transient protection of a sensitive surface of substrate. This in turn can extend available queue time between fabrication steps. During semiconductor fabrication, many surfaces are sensitive to airborne molecular contaminants (AMCs) in the surrounding environment. Queue time can lead to exposure to the AMCs and unwanted interactions such as oxidation, corrosion, and halogenation. FIG. 1B shows an example of a method for protection of a sensitive surface of a substrate. At operation 121, a substrate including an environmentally sensitive surface is provided. The surface may be a planar surface or include one or more pillars, holes, and trenches, including HAR structures. Examples of substrate surfaces that can be sensitive to environmental queue time effects include silicon, silicon germanium, and germanium structures such as fins and nanowires, metal surfaces including but not limited to copper, cobalt, titanium, titanium nitride, tungsten or molybdenum, and/or other structures and materials.

The surface is then coated with a solution including an SRP in an operation 123. The substrate is then dried in an operation 125, forming a protective coating including SRP on the sensitive substrate. The substrate can then be stored in ambient conditions in an operation 127. When ready for further processing, the substrate is exposed to a stimulus that degrades all or a top portion of the SRP in an operation 129. As described further below, operation 129 may involve controlled exposure to a compound or to two reactants that react to form a compound that degrades the SRP. The stimulus is any compound that scissions bonds of the SRP to degrade it. In some embodiments, the compound is a relatively strong add or base. Volatile monomers or fragments from the degraded polymer can then be removed from the structure in an operation 131. If SRP is still present, operations 129 and 131 are repeated one or more times to fully remove the SRP in an operation 133. The amount of removed in each repetition may be the same or different.

FIGS. 1A and 15 are flow diagrams showing certain operations in examples semiconductor fabrication processes that use SRPs, though the methods described herein are not limited to particular applications but may be used with any application in which SRPs are removed from any surface. The thickness of an SRP film before any removal may be expressed as a total thickness ($T_{total}$). If the thickness varies across a surface, $T_{total}$ is the maximum thickness. In certain embodiments of the methods described herein, an amount of SRP that is removed at any one removal operation is less than $T_{total}$, i.e., the SRP is removed portion by portion in multiple removal cycles. In other embodiments, all of the SRP may be removed in a cycle.

Figure 3:
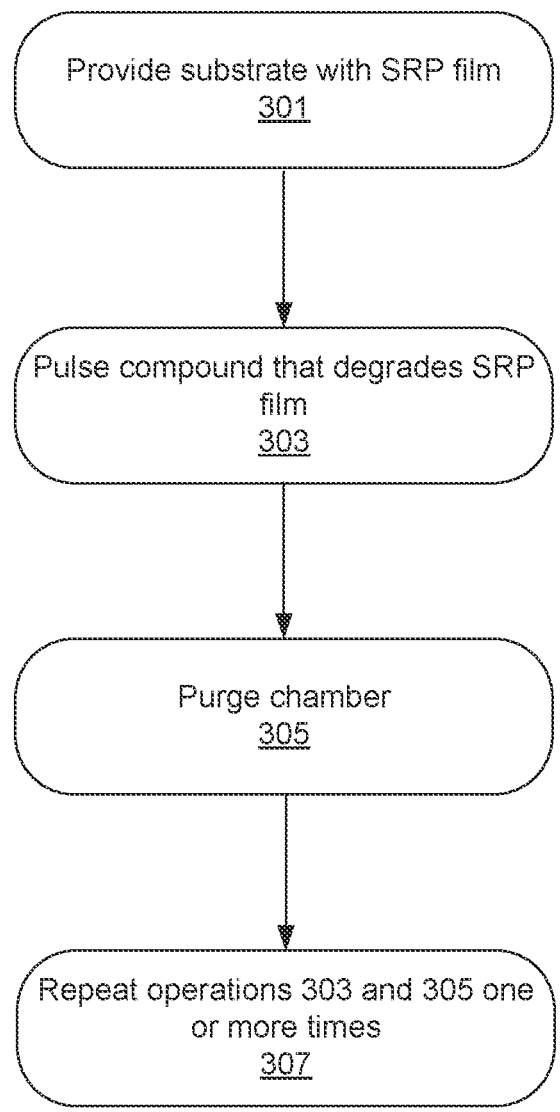
FIGS. 3 and 4 are process flow diagrams showing examples of methods of controlled exposure to degrade an SRP.

In some embodiments, the SRP is directly exposed to pulses of a vapor phase compound (e.g., a base or acid) that can degrade the SRP. For example, hydrogen bromide (HBr), hydrogen chloride (HCl), hydrogen fluoride (HF), hydrogen iodide (HI), nitric acid (HNO3), formic acid ($CH_2O_2$), acetic acid ($CH_3COOH$), formonitrile (HCN), or ammonia ($NH_3$), various methyl or ethyl amines gas or vapor may be used. In some examples, when HBr vapor is used, the substrate is maintained at a pressure in a range from 5 mT to 5000 mT and a temperature in a range from 0° C. to 100° C. In some examples, the substrate is maintained at a pressure in a range from 750 mT to 1500 mT and a temperature in a range from 35° C. to ° C. In some examples, the temperature of the substrate is maintained at a pressure of 1000 mT and a temperature of 60° C. The amount of acidic vapor or vapor of other compound is controlled to limit the diffusion. FIG. 3 is a process flow diagram showing an example of a method of controlled exposure to a compound to degrade the SRP. A substrate is provided with SRP film in an operation 301. Examples of apparatus that the substrate may be provided to are described below with reference to Figure S. In some embodiments, operation 301 involves providing the substrate to a processing chamber. In other embodiments, the substrate is in the chamber from a previous processing operation. The SRP may be provided in a variety of forms—for example, in a gap between features of a structure or as blanket film on all or part of a substrate.

A compound is pulsed into the chamber in an operation 303. The partial pressure of the vapor and/or the pulse time can be controlled to control the overall exposure to the vapor and the diffusion depth. The chamber can be purged in an operation 305, Purging can involve evacuating the chamber and/or flowing inert gas to be swept out through the chamber. Such a gas may be, for example, continuously flowing including during operation 303 or may be itself pulsed into the chamber. During operation 305 volatilized monomer or SRP fragment may be pumped or purged out of the chamber. Operations 303 and 305 are repeated until the SRP is removed in an operation 307.

Figure 4:
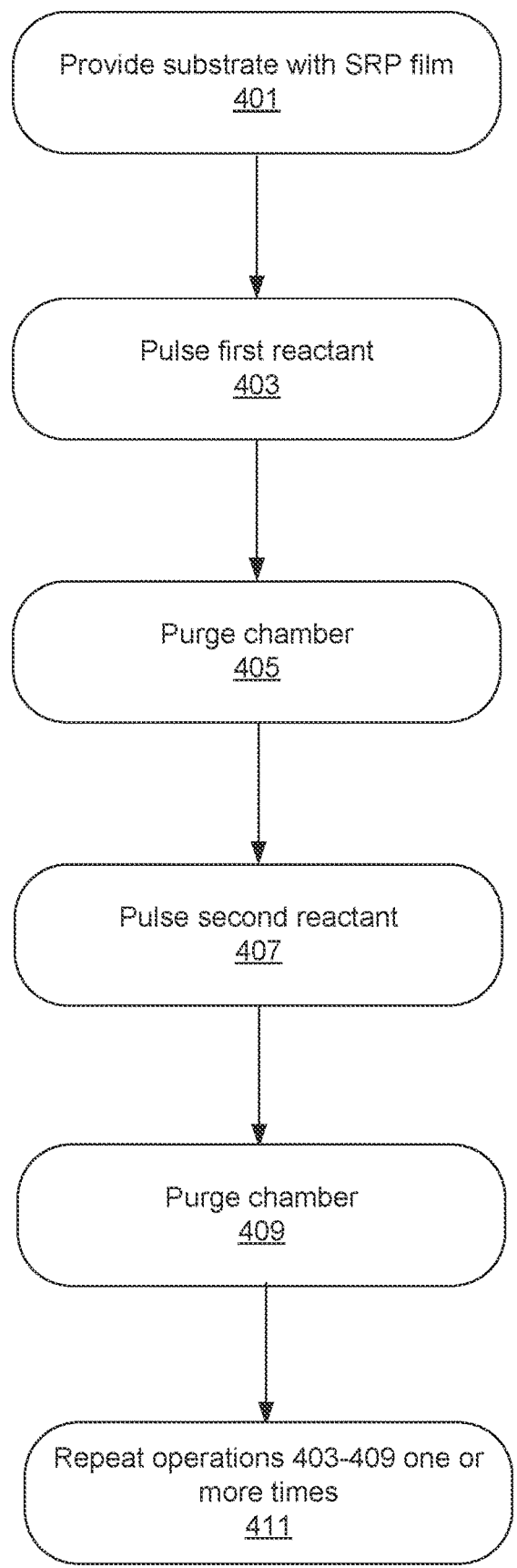

As indicated above, in some embodiments, the SRP is exposed to reactants sequentially in each cycle. This can provide additional control over the process and may be implemented in various ways. In some embodiments, diffusion of both reactants is tightly controlled. This can provide additional control over removal process as the film will only degrade to a depth where both reactants are present. Thus, if one of the two reactants diffuses more than targeted, diffusion of the other reactant can still control the amount of film removed. FIG. 4 shows an example of a process flow that may be used in accordance with embodiments. A substrate is provided with SRP film in an operation 401, as described above with respect to operation 301 in FIG. 3. At this stage, prior to removal, the SRP film has a thickness $T_{total}$. A first reactant is pulsed into the chamber in an operation 403. The substrate temperature and the partial pressure of the vapor and/or the pulse time can be controlled to control the overall exposure to the vapor and the diffusion depth. As a result of operation 403, the first reactant diffuses through a top portion of the SRP film. The chamber can be purged in an operation 405. Purging can involve evacuating the chamber and/or flowing inert gas to be swept out through the chamber. Such a gas may be, for example, continuously flowing including during operation 403 or may be itself pulsed into the chamber. A second reactant is then pulsed in operation 407. Like in operation 403, the substrate temperature and partial pressure of the vapor and/or pulse time can be controlled to limit the diffusion depth. The first reactant and the second reactant react to form a compound that itself reacts with the SRP to scission its bonds. The SRP is degraded to the depth that both reactants diffused. The chamber can be purged in an operation 409 as described above. During operation 409 volatilized monomer or SRP fragment may be pumped or purged out of the chamber. Operations 403-409 are repeated until the SRP is removed in an operation 411. In some embodiments, operation 411 may not be performed. For example, in a surface protection application where bracing HAR features is not a concern, a single cycle may be sufficient to remove the SRP. In such cases, the reactants may be diffused throughout the entire thickness of the film in operations 403 and 407.

Figure 5:
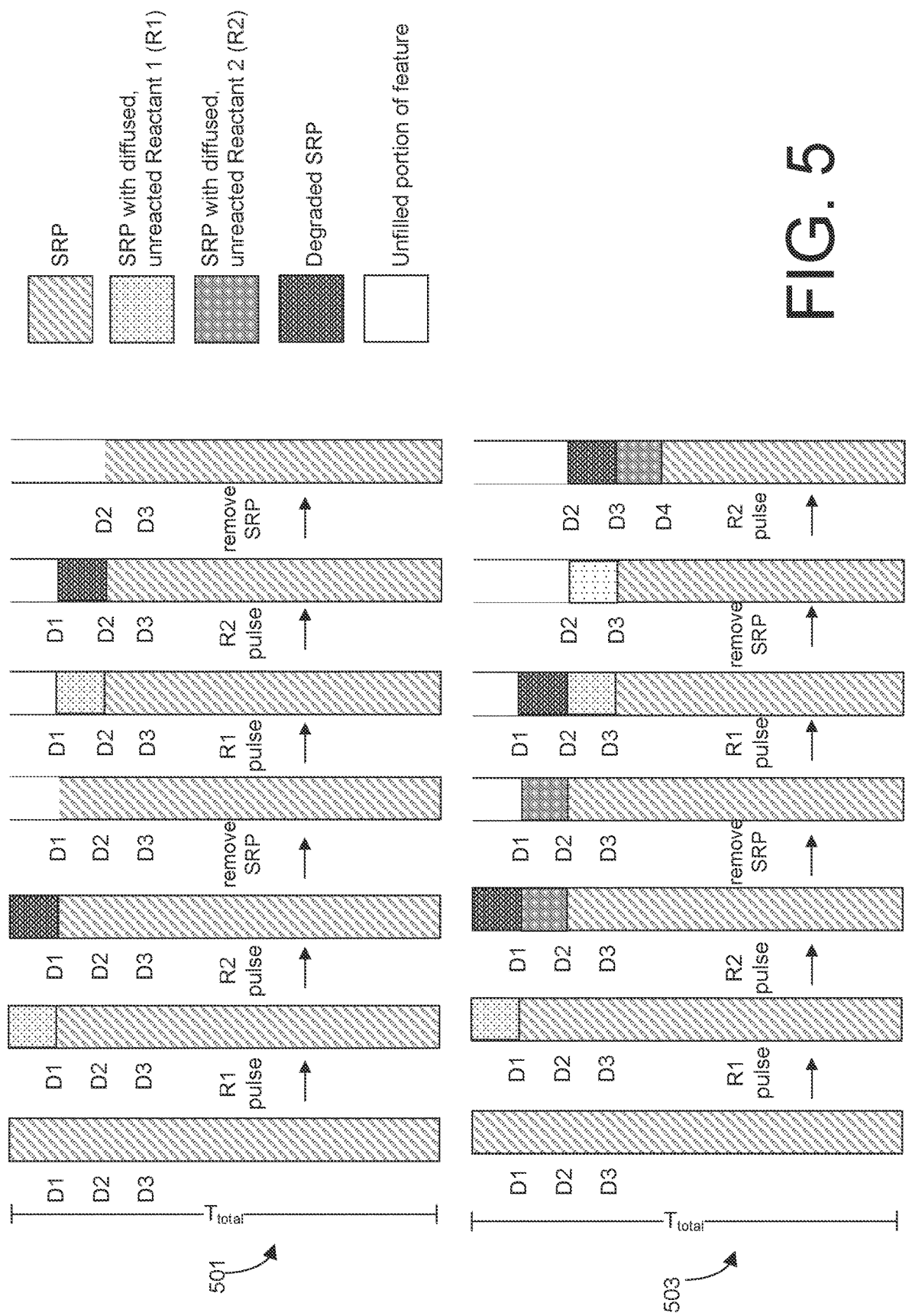
FIG. 5 shows sequences of side cross-sectional views of removing SRP from HAR structures according to various embodiments of the method of FIG. 4.

In the example of FIG. 4, the target diffusion depth of each reactant may be the same or different. FIG. 5 shows examples of different embodiments, First, at 501, a sequence of side cross-sectional views of a HAR structure filled with SRP is shown. The sequence shows two cycles of SRP removal according in an example of a method according to FIG. 4 in which each reactant is targeted to diffuse to the same depth. A first pulse of reactant 1 (R1) results in diffusion to a depth D1 followed by a first pulse of reactant 2 (R2) that results in diffusion to D1. The reactants react, forming a compound that degrades the SRP to D1. The degraded SRP is removed leaving the gap unfilled to D1. The cycle repeats removing SRP to a depth D2. The cycles can continue until the SRP is removed.

At 503, another sequence of side cross-sectional views of a HAR gap filled with SRP is shown. The sequence shows two cycles of SRP removal according in an example of a method according to FIG. 4 in which each reactant is targeted to diffuse to a depth beyond the diffusion depth of the previous reactant pulse. A first pulse of reactant 1 (R1) results in diffusion to a depth D1 followed by a first pulse of reactant 2 (R2) that results in diffusion to D2. The reactants react, forming a compound that degrades the SRP to D1, and leaves unreacted reactant R2 to a depth D2. The degraded SRP is removed leaving the gap unfilled to D1 with unreacted reactant R2 present in the SRP to D2. The next reactant pulse R1 is done to a target depth D3. The reactants react, forming a compound that degrades the SRP to D2, and leaves unreacted reactant R1 to a depth D3. The degraded SRP is removed leaving the gap unfilled to D2 with unreacted reactant R1 present in the SRP to D3. The next reactant pulse R2 is done to a target depth D4. The reactants react, forming a compound that degrades the SRP to D3, and leaves unreacted reactant R2 to a depth D4. The cycles can continue until the SRP is removed. As can be seen by comparing sequence 503 to sequence 501, allowing each pulse of reactant to diffuse further into the SRP than the previous reactant pulse can reduce the number of cycles, though each pulse may take longer.

Figure 6:
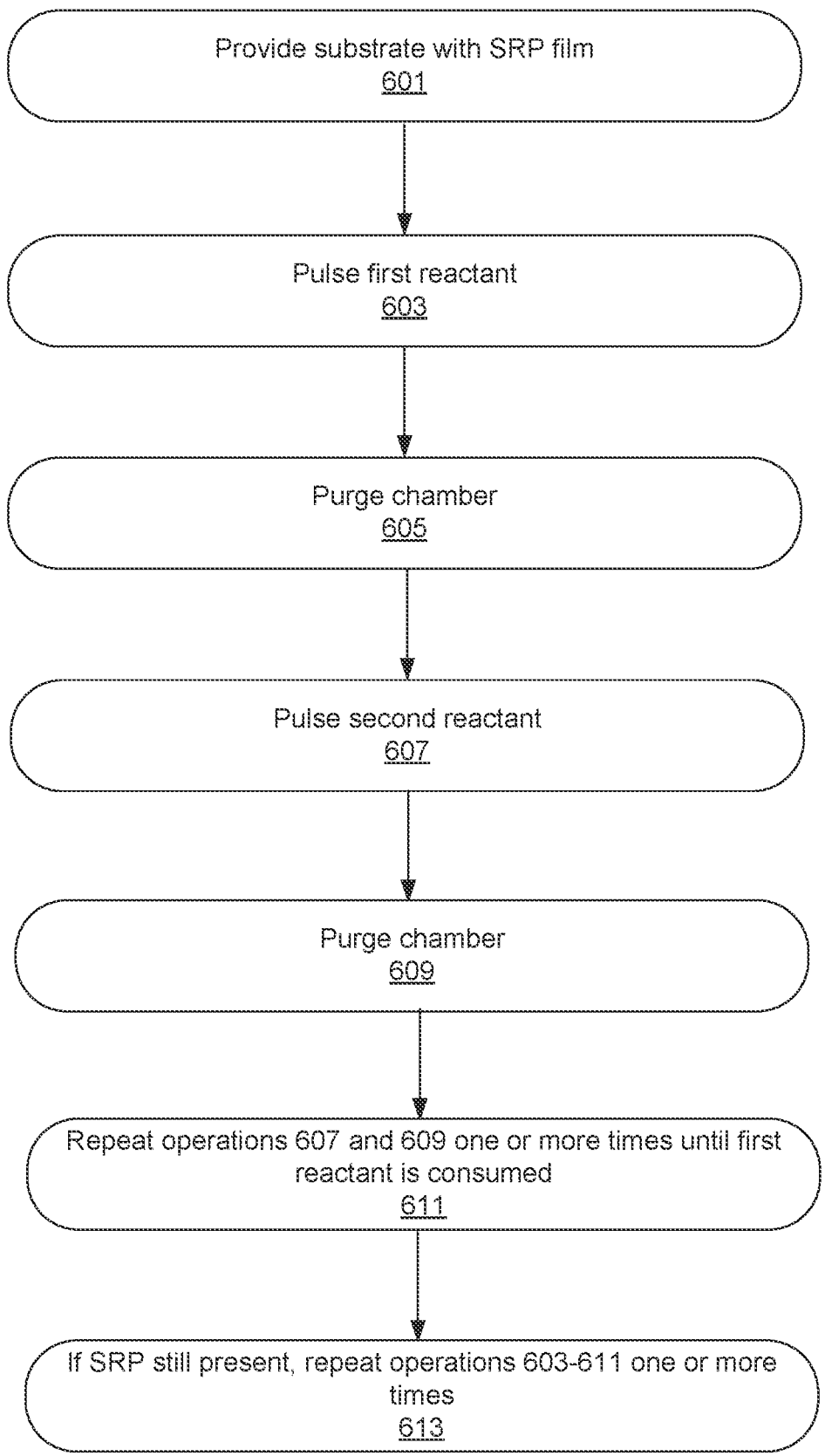
FIG. 6 is process flow diagrams showing an example of a method of controlled exposure to degrade an SRP.

In some embodiments, the SRP is exposed to a first reactant, which is allowed to diffuse throughout all of or a first portion of the SRP, followed by multiple pulses of the second reactant, each of which results in diffusion of the second reactant and SRP degradation in only a top portion of the SRP. FIG. 6 shows an example of a process flow that may be used in accordance with embodiments.

A substrate is provided with SRP film in an operation 601, as described above with respect to operation 301 in FIG. 3. A first reactant is pulsed into the chamber in an operation 603. The substrate temperature and partial pressure of the vapor and/or the pulse time can be controlled to control the overall exposure to the vapor and the diffusion depth. As a result of operation 603, the first reactant diffuses through the SRP film to a target diffusion depth. In some embodiments, the target diffusion depth may be the entire depth of the SRP film, i.e., $T_{total}$. In other embodiments, it may be less than the entire depth, e.g., half $T_{total}$, one quarter of the $T_{total}$, etc. The chamber can be purged in an operation 605.

Purging can involve evacuating the chamber and/or flowing inert gas to be swept out through the chamber. Such a gas may be, for example, continuously flowing including during operation 603 or may be itself pulsed into the chamber. A second reactant is then pulsed in operation 607. In operation 607, the target diffusion depth is less than that for the first reactant in operation 603. For example, if the first reactant diffused throughout the entire depth or half the entire depth in operation 603, the target diffusion depth in operation 607 may be one-fifth or one-fourth of the depth. The first reactant and the second reactant react to form a compound that itself reacts with the SRP to scissions its bonds. The SRP is degraded only to the depth that the second reactant diffused. Thus, the second reactant diffusion depth controls the overall removal rate. The chamber can be purged in an operation 609 as described above. During operation 609 volatilized monomer or SRP fragment may be pumped or purged out of the chamber. In an operation 611, operations 607 and 609 are repeated until the first reactant is consumed. In embodiments in which the first reactant diffuses through the entire film, the SRP may be completely removed after operation 611. In other embodiments, in an operation 613, operations 603-611 may be repeated one or more times until the SRP is completely removed.

Figure 7:
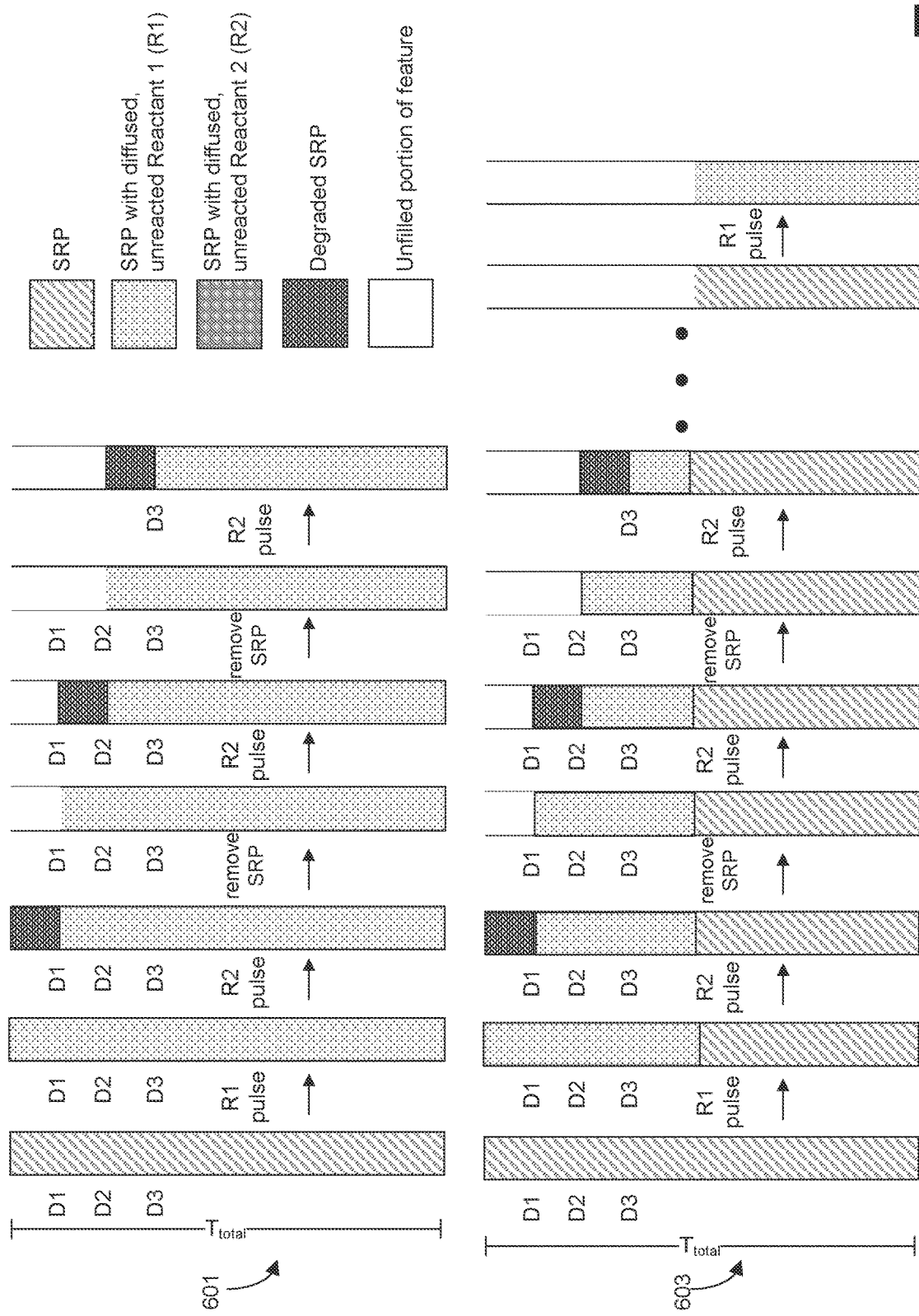
FIG. 7 shows sequences of side cross-sectional views of removing SRP from HAR structures according to various embodiments of the method of FIG. 6.

FIG. 7 shows examples of different embodiments according to the method described in FIG. 6. First, at 701, a sequence of side cross-sectional views of a HAR structure filled with SRP is shown. The sequence shows multiple cycles of SRP removal according in an example of a method according to FIG. 6 in which the first reactant is targeted to diffuse to entire depth of the SRP. A first pulse of reactant 2 (R2) results in diffusion to a depth D1, The reactants react, forming a compound that degrades the SRP to D1. The degraded SRP is removed leaving the gap unfilled to D1, The R2-removal cycle repeats removing SRP to a depth D2, The cycles can continue until the SRP is removed.

At 703, another sequence of side cross-sectional views of a HAR structure filled with SRP is shown. The sequence shows multiple cycles of SRP removal according in an example of a method according to FIG. 6 in which the first reactant is targeted to diffuse to half the depth of the SRP. A first pulse of reactant 2 (R2) results in diffusion to a depth D1. The reactants react, forming a compound that degrades the SRP to D1. The degraded SRP is removed leaving the gap unfilled to D1. The R2—removal cycle repeats removing SRP to a depth D2. The cycles can continue until the SRP is removed from half the gap depth. Reactant 1 is then pulsed again to diffuse to the bottom of the gap. The R2—removal cycles can then be repeated (not shown) until the film is completely removed.

Stimulus Compounds and Reactants

Examples of compounds that may be used to degrade SRPs includes adds (e.g., having a pKa of less than 7, and in some embodiments less than 4, or less than 2) and bases (e.g., having a pKb of less than 7, and in some embodiments, less than 4 or less than 2).

Examples of reactants which can be pulsed to in an alternate fashion to produce compounds which are effective to scission SRPs include $SO_2$ (sulfur dioxide) and water ($H_2O$) which react to form sulfurous acid ($H_2SO_3$), nitrogen dioxide ($NO_2$) and water to form nitric acid ($HNO_3$), carbon dioxide ($CO_2$) and water to form carbonic acid ($H_2CO_3$), and ammonia ($NH_3$) and water to form ammonium hydroxide ($NH_4OH$). Other oxides may react with water or another reactant to form acids or bases.

In some embodiments, reactants that form hydrogen bonds (e.g., $H_2O$ or $NH_3$) may be used as the first reactant in a scheme such as shown in FIGS. 6 and 7. This is because hydrogen bonding may be useful for having the reactant adsorb in the film once diffused.

According to various embodiments, the reaction may be catalyzed or uncatalyzed. In some embodiments, a catalyst (e.g., a thermally activated catalyst) may be provided in the SRP, delivered with a reactant, or introduced as a separate pulse. However, in many embodiments, the reaction is uncatalyzed such that SRP is provided free of catalysts. This can facilitate SRP removal.

In some embodiments, the reaction is byproduct-free.

SRPs

Example of SRPs are provided below. However, the methods described herein may be used with any SRPs. In some embodiments, the SRPs are copolymers including poly(aldehydes). In particular embodiments, they may be self-immolative polymers as described in U.S. Patent Publication No. 2018/0155483, which was published on Jun. 7, 2018 and which is hereby incorporated herein by reference in its entirety. Examples of copolymers in that reference include those of Formula I:

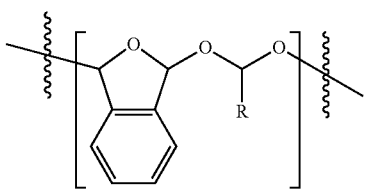

Formula I wherein R is substituted or unsubstituted $C_1$-$C_{20}$ alkyl, $C_1$-$C_{20}$ alkoxyl, $C_2$-$C_{20}$ alkenyl, $C_2$-$C_{20}$ alkynyl, $C_6$-$C_{10}$ heteroaryl, $C_3$-$C_{10}$ cycloalkyl, $C_3$-$C_{10}$ cycloalkenyl, $C_3$-$C_{10}$ heterocycloalkyl, or $C_3$-$C_{10}$ heterocycloalkenyl; and, when substituted, R is substituted with $C_1$-$C_{20}$ alkyl, $C_1$-$C_{20}$ alkoxy, $C_2$-$C_{20}$ alkenyl, $C_2$-$C_{20}$ alkynyl, $C_6$-$C_{10}$ aryl, $C_6$-$C_{10}$ heteroaryl, aldehyde, amino, sulfonic acid, sulfinic acid, fluoroacid, phosphoric acid, ether, halide, hydroxy, ketone, nitro, cyano, azido, silyl, sulfonyl, sulfinyl, or thiol.

In particular embodiments, the SRPs are cyclic copolymers of the phthalaldehyde monomer with a second aldehyde such as ethanal, propanal, or butanal. Examples of such copolymers are given in U.S. Patent Publication No. 2018/015548 as Formula II:

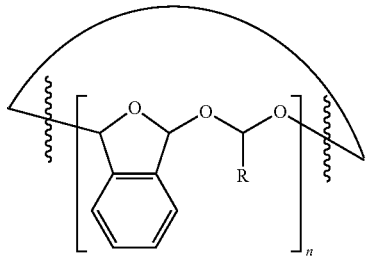

Formula II

Specific examples in U.S. Patent Publication No. 2018/015548 include copolymers of PHA and one or more of acetaldehyde, propanal, butanal, pentanal, hexanal, heptanal, octanal, nonanal, decanal, undecanal, propenal, butenal, pentenal, hexenal, heptanal, octenal, nonenal, decenal, undecenal, and any combination thereof.

The SRPs may also be any appropriate linear or cyclic copolymer including the pure phthalaldehyde homopolymer. It also may be a homopolymer of poly(phthalaldehyde) derivatives such as poly(4,5-dichlorophthalaldehyde).

Apparatus

Figure 8:
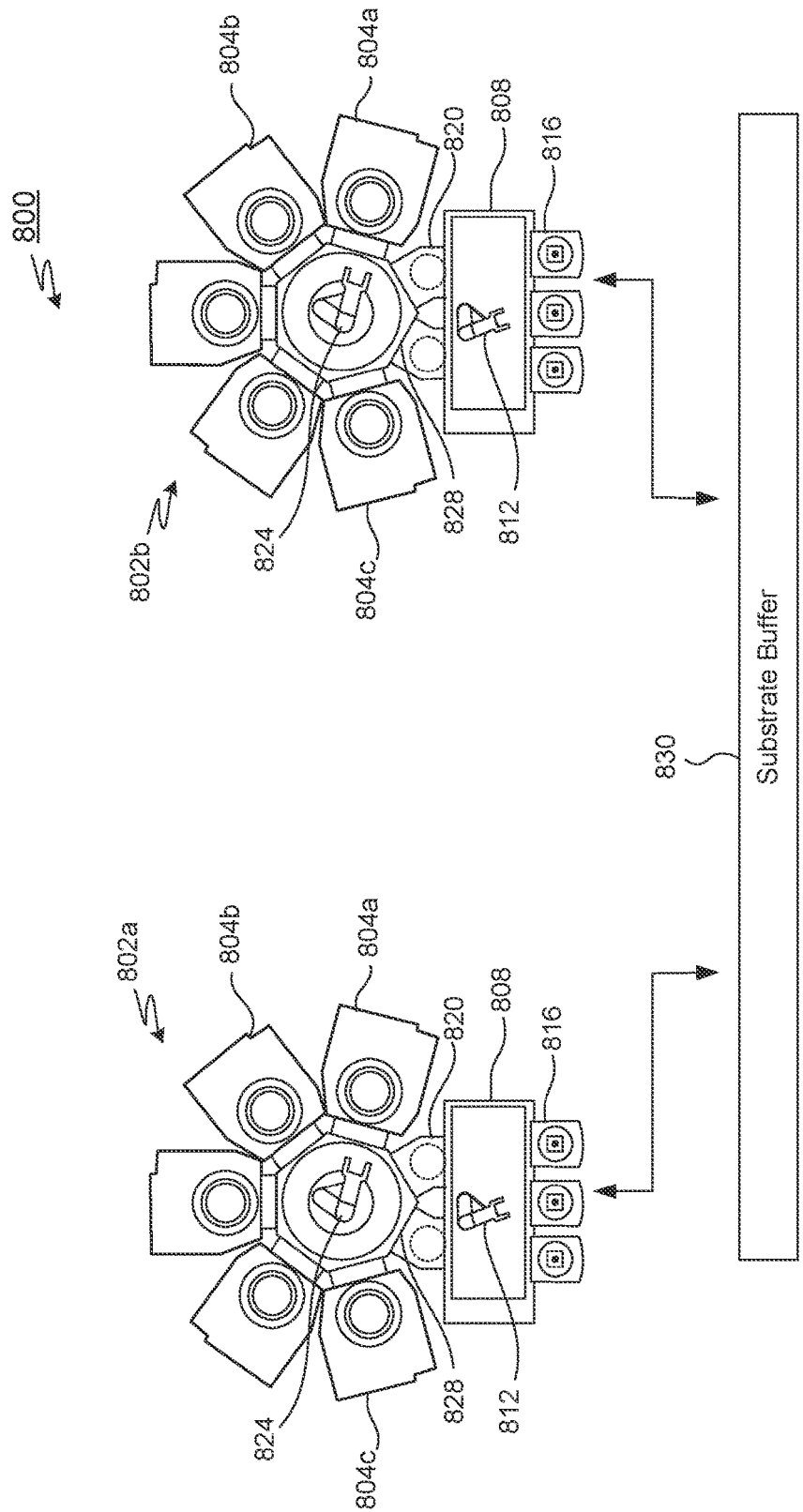
FIG. 8 is a functional block diagram of an example of a substrate processing system including multiple substrate processing tools and a storage buffer according to the present disclosure.

The removal processes described may be implemented in a chamber which may be part of a substrate processing system. The substrate processing system may further include one or more additional substrate processing tools used to process substrates including deposition of SRPs and upstream and downstream processing. Referring now to FIG. 8, a substrate processing system 800 includes one or more substrate processing tools 802 (substrate processing tools 802a and 802b are shown for illustration purposes) and substrate buffer 830 or other substrate storage. Each of the substrate processing tools 802a and 802b includes a plurality of processing chambers 804a, 804b, 804c, etc. (collectively processing chambers 804). For example only, each of the processing chambers 804 may be configured to perform a substrate treatment. In some examples, the substrates may be loaded into one of the processing chambers 804, processed, and then moved to one or more other ones of the processing chambers 804 and/or removed from the substrate processing tool 800 (e.g., if all perform the same treatment).

Substrates to be processed are loaded into the substrate processing tools 802a and 802b via ports of a loading station of an atmosphere-to-vacuum (ATV) transfer module 808. In some examples, the ATV transfer module 708 includes an equipment front end module (EFEM). The substrates are then transferred into one or more of the processing chambers 804, For example, a transfer robot 812 is arranged to transfer substrates from loading stations 816 to load locks 820. A vacuum transfer robot 824 of a vacuum transfer module 828 is arranged to transfer substrates from the load locks 820 to the various processing chambers 804.

After processing in one or more of the substrate processing tools 802a and 802b, the substrates may be transported outside of a vacuum environment. For example, the substrates may be moved to a location for storage (such as the substrate buffer 830). In other examples, the substrates may be moved directly from the substrate processing tool to another substrate processing tool for further processing or from the storage buffer 830 to another substrate processing tool for further processing.

Exposure of the substrate to ambient conditions may cause defects or otherwise adversely impact downstream processing. A sacrificial protective layer including an SRP can be added to the substrate prior to exposure to ambient conditions. In some examples, the sacrificial protective layer is applied in the substrate processing tool prior to transferring the substrate to the substrate buffer for storage or to another substrate processing tool. In other examples, the sacrificial protective layer is applied in another processing chamber (not associated with the substrate processing tool).

Prior to performing another treatment on the substrate, the sacrificial protective layer is removed as described herein. For example, the substrate may be transferred to the substrate processing tool 802*b* after a period of storage in the storage buffer 830 or after processing in the substrate processing tool 802*a*. The sacrificial protective layer may be removed in one of the processing chambers in the substrate processing tool 802*b*, or another processing chamber (not associated with the substrate processing tool 802*b*). In some embodiments, the sacrificial protective layer is removed in a load lock 820.

In some examples, the sacrificial protective layer is applied by a processing chamber in the same substrate processing tool (that performed substrate treatment) prior to exposure to ambient conditions. Since the substrate processing tool operates at vacuum, exposure of the substrate to ambient conditions is prevented. In some examples, the sacrificial layer is deposited after a wet clean process. In this case, oxides and residues may be removed by the wet clean process and the sacrificial layer is deposited in sequence prior to drying the wafer or immediately after drying the wafer. In some examples, this process is not done under vacuum and is done without any exposure of the dry pristine surface to the ambient. In other examples, the substrate is transported from the substrate processing tool to another processing chamber located outside of the substrate processing tool that adds the sacrificial protective layer. Using this approach limits or reduces the period of exposure of the substrate to ambient conditions. Exposure is limited to a brief period of transport from the substrate processing tool to the processing chamber where the sacrificial protective layer is applied. Storage of the substrate may be performed for longer periods without additional exposure to ambient conditions. Subsequently, the sacrificial protective layer may be removed prior to further processing. In some examples, the sacrificial protective layer is removed in another substrate processing tool under vacuum conditions prior to substrate treatment in processing chambers of the same substrate processing tool. In other examples, the substrate is transported to a processing chamber that removes the sacrificial protective layer and then to the substrate processing tool for further processing. This approach also limits exposure to ambient conditions between the processing chamber and the substrate processing tool or other environment. In one example, the sacrificial protective layer is formed immediately after etch, deposition, or other process by exposing the substrate to a small molecule vapor that condenses on the surface to form a film. This can be performed directly inside the tool in which the etch or deposition occurred (e.g., substrate processing tool 802*a*) and may occur in the same processing chamber in which the etch or deposition occurred. The substrate is then taken to the next tool for processing (e.g., substrate processing tool 802*b*). Once the substrate is again no longer exposed to ambient conditions (for example by bringing the substrate under vacuum or an atmosphere purged with an inert gas), vacuum and compounds, and in some cases, other stimuli, as described above are applied to induce the film to degrade and be removed from the substrate. This may take place inside of a processing chamber as described above (e.g., process chamber 804*a* of substrate processing chamber 802*b*).

In various embodiments, a system controller is employed to control process conditions during processing including during the SRP removal. The controller will typically include one or more memory devices and one or more processors. A processor may include a CPU or computer, analog and/or digital input/output connections, stepper motor controller boards, etc.

The controller may control all the activities of a removal apparatus. The system controller executes system control software, including sets of instructions for controlling the timing, mixture of gases, chamber pressure, chamber temperature, wafer temperature, wafer chuck or pedestal position, plasma power, and other parameters of a particular process. Other computer programs stored on memory devices associated with the controller may be employed in some embodiments.

Typically, there will be a user interface associated with the controller. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the reactant pulses and purge gas flows and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, substrate temperature, and plasma power. These parameters are provided to the user in the form of a recipe and may be entered utilizing the user interface.

Signals for monitoring the process may be provided by analog and/or digital input connections of the system controller. The signals for controlling the process are output on the analog and digital output connections of the system.

The system software may be designed or configured in many ways.

For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. The parameters may be specific to the type of process to be performed and the type of tool that the controller is configured to interface with or control, Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a PVD chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma power program may control plasma power.

Examples of chamber sensors that may be monitored during removal include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility, Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
providing to a chamber a high aspect ratio (HAR) structure having a stimulus responsive polymer (SRP) in a high aspect ratio gap formed between features of the HAR structure, the high aspect ratio gap having an aspect ratio of at least 8 and a total thickness $T_{total}$; and
performing one or more cycles of removing the SRP from the gap comprising, each cycle comprising:
(a) pulsing a first reactant to the chamber such that the first reactant diffuses into the gap only to a depth less than $T_{total}$;
(b) after (a), purging the chamber,
(c) after (b), pulsing a second reactant to the chamber such that the second reactant diffuses into the gap only to a depth less than $T_{total}$;
(d) reacting the first reactant and the second reactant to form a compound that degrades the SRP;
(e) degrading a thickness of SRP that is less than $T_{total}$; and
(f) removing the degraded SRP.

2. The method of claim 1, wherein the SRP comprises a poly(phthalaldehyde) or a derivative thereof as a homopolymer or as one of the polymers of a copolymer.

3. The method of claim 1, wherein the SRP comprises a poly(aldehyde) or a derivative thereof as a homopolymer or as one of the polymers of a copolymer.

4. The method of claim 1, wherein the first or second reactant is water vapor.

5. The method of claim 4, wherein the other of the first or second reactant is a gaseous oxide that reacts with the water vapor to an acidic or basic species.

6. The method of claim 5, wherein the gaseous oxide is nitrogen dioxide.

7. The method of claim 5, wherein the gaseous oxide is sulfur dioxide.

8. The method of claim 5, wherein the gaseous oxide is carbon dioxide.

9. The method of claim 4, wherein the other of the first or second reactant is ammonia.

10. The method of claim 1, wherein a target diffusion depth in (a) and (c) is the same.

11. The method of claim 1, wherein a target diffusion depth in (a) and (c) is different.

12. The method of claim 1, wherein the reaction in (d) is uncatalyzed.

13. The method of claim 1, wherein the compound is an acid or base.

14. A method comprising:
providing to a chamber a high aspect ratio (HAR) structure having a stimulus responsive polymer (SRP) in a high aspect ratio gap formed between features of the HAR structure, the high aspect ratio gap having an aspect ratio of at least 8 and the SRP having a total thickness $T_{total}$; and
performing one or more cycles of removing the SRP from the gap comprising, each cycle comprising:
(a) pulsing first reactant to the chamber such that the first reactant diffuses into the gap to a depth $D_{first\ reactant}$;
(b) after (a), purging the chamber,
(c) after (b), pulsing a second reactant to the chamber such that the second reactant diffuses into the gap only to a depth $D_{second\ reactant}$, wherein $D_{second\ reactant}$ is less than $D_{first\ reactant}$;
(d) reacting the first reactant and the second reactant to form a compound that degrades the SRP;
(e) degrading the SRP to a depth $D_{second\ reactant}$; and
(f) removing the degraded SRP.

15. The method of claim 14, wherein the SRP comprises a poly(phthalaldehyde) or a derivative thereof as a homopolymer or as one of the polymers of a copolymer.

16. The method of claim 14, wherein the SRP comprises a poly(aldehyde) or a derivative thereof as a homopolymer or as one of the polymers of a copolymer.

17. The method of claim 14, wherein the first or second reactant is water vapor.

18. The method of claim 17, the other of the first or second reactant is a gaseous oxide that reacts with the water vapor to an acidic or basic species.

19. The method of claim 18, wherein the gaseous oxide is nitrogen dioxide.

20. The method of claim 18, wherein the gaseous oxide is sulfur dioxide.

21. The method of claim 18, wherein the gaseous oxide is carbon dioxide.

22. The method of claim 18, wherein the other of the first or second reactant is ammonia.

23. The method of claim 14, wherein $D_{first\ reactant}$ is equal to $T_{total}$ such that the first reactant is diffused through the total thickness of the SRP in a single cycle.

24. The method of claim 14, $D_{first\ reactant}$ is less than $T_{total}$ and multiple cycles are performed.

25. The method of claim 14, wherein the reaction in (d) is uncatalyzed.

26. The method of claim 14, wherein the compound is one of sulfurous acid, nitric acid, carbonic acid, and ammonium hydroxide.

27. A method comprising:
providing a substrate having a stimulus responsive polymer (SRP) thereon;
performing multiple removal cycles, each cycle comprising:
exposing only a top portion of the SRP to a compound capable of degrading the SRP to thereby degrade the top portion of the SRP; and
removing only the top portion of the SRP, wherein exposing the top portion of the SRP comprises sequential pulsing of a first reactant and a second reactant, wherein the first reactant and the second reactant react to form the compound.

28. The method of claim 27, wherein the SRP is provided without a catalyst.

29. The method of claim 27, wherein exposing the top portion of the SRP to a compound comprises pulsing the compound in vapor phase into a chamber housing the substrate.

30. The method of claim 28, wherein the compound is one of hydrogen bromide (HBr), hydrogen chloride (HCl), hydrogen fluoride (HF), hydrogen iodide (HI), nitric acid ($HNO_3$), formic acid ($CH_2O_2$), acetic acid ($CH_3COOH$), formonitrile (HCN), or ammonia ($NH_3$), and an alkyl amine gas.

31. The method of claim 27, wherein the first reactant and second reactant react in the top portion of the SRP.

32. The method of claim 27, wherein sequential pulsing of the first reactant and the second reactant comprises a first pulse of the first reactant followed by multiple sequential pulses of the second reactant.

33. The method of claim 27 wherein sequential pulses are separated by gas purges.

34. The method of claim 27, wherein the SRP comprises a poly(phthalaldehyde) or a derivative thereof as a homopolymer or as one of the polymers of a copolymer.

35. The method of claim 27, wherein the SRP comprises a poly(aldehyde) or a derivative thereof as a homopolymer or as one of the polymers of a copolymer.

36. The method of claim 27, wherein the SRP is provided between features of high aspect ratio (HAR) structures having aspect ratios of at least 8.

37. The method of claim 27, wherein the SRP is provided as a protective coating on the substrate.

* * * * *